United States Patent
Kang

(10) Patent No.: US 10,948,169 B2
(45) Date of Patent: Mar. 16, 2021

(54) LED LAMP APPARATUS FOR VEHICLE

(71) Applicant: HYUNDAI MOBIS CO., LTD., Seoul (KR)

(72) Inventor: Hyun Woo Kang, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 16/557,409

(22) Filed: Aug. 30, 2019

(65) Prior Publication Data

US 2020/0072447 A1 Mar. 5, 2020

(30) Foreign Application Priority Data

Sep. 4, 2018 (KR) .......................... 10-2018-0105211

(51) Int. Cl.
| | |
|---|---|
| *F21V 29/00* | (2015.01) |
| *F21V 19/00* | (2006.01) |
| *F21V 29/70* | (2015.01) |
| *F21S 45/48* | (2018.01) |
| *F21S 41/141* | (2018.01) |

(52) U.S. Cl.
CPC .......... *F21V 19/003* (2013.01); *F21S 41/141* (2018.01); *F21S 45/48* (2018.01); *F21V 29/70* (2015.01)

(58) Field of Classification Search
CPC ........ F21S 41/148; F21S 41/192; F21S 41/19; F21S 45/47
See application file for complete search history.

(56) References Cited

U.S. PATENT DOCUMENTS

| | | | |
|---|---|---|---|
| 3,962,597 A * | 6/1976 | Clark | H01J 11/00 |
| | | | 313/586 |
| 8,154,683 B2 | 4/2012 | Yoneda et al. | |
| 8,354,684 B2 | 1/2013 | West | |
| 9,689,558 B2 | 6/2017 | Matsunaga | |
| 2008/0225533 A1 | 9/2008 | Huang et al. | |
| 2011/0235357 A1* | 9/2011 | Myojin | F21S 41/148 |
| | | | 362/519 |
| 2014/0293631 A1* | 10/2014 | Lee | F21S 41/16 |
| | | | 362/509 |
| 2016/0281946 A1* | 9/2016 | Zojceski | F21S 43/14 |
| 2016/0298818 A1* | 10/2016 | Duarte | F21S 45/47 |
| 2018/0023779 A1* | 1/2018 | Seif | H01L 33/64 |
| | | | 257/88 |

(Continued)

FOREIGN PATENT DOCUMENTS

| | | |
|---|---|---|
| JP | 2013-135145 | 7/2013 |
| JP | 2014-502062 | 1/2014 |

(Continued)

OTHER PUBLICATIONS

Office Action dated Aug. 25, 2020, in Japanese Patent Application No. 2019-160259.

*Primary Examiner* — Andrew J Coughlin
(74) *Attorney, Agent, or Firm* — H.C. Park & Associates, PLC

(57) ABSTRACT

Disclosed herein is an LED lamp apparatus for a vehicle, which includes a heat sink, a printed circuit board including an electric circuit and disposed on the heat sink, an LED disposed between the heat sink and the printed circuit board, the LED being in contact with the heat sink, and an electrode binder extending to the LED through the printed circuit board and electrically connecting the printed circuit board and the LED.

13 Claims, 6 Drawing Sheets

(56) References Cited

U.S. PATENT DOCUMENTS

| 2018/0086249 A1* | 3/2018 | Dorn | F21S 41/148 |
| 2019/0041019 A1* | 2/2019 | Kanamori | F21S 43/195 |
| 2019/0086049 A1* | 3/2019 | Onoda | H01S 5/005 |

FOREIGN PATENT DOCUMENTS

| JP | 2015-037056 | 2/2015 |
| JP | 2015-088707 | 5/2015 |
| JP | 2018-092847 | 6/2018 |
| KR | 10-1848557 | 4/2018 |
| WO | 2010/061868 | 6/2010 |

* cited by examiner

SECTION C-C'

LED LAMP APPARATUS FOR VEHICLE

CROSS-REFERENCE TO RELATED APPLICATION

This application claims priority from and the benefit of Korean Patent Application No. 10-2018-0105211, filed on Sep. 4, 2018, which is hereby incorporated by reference for all purposes as if set forth herein.

BACKGROUND

Field

Exemplary embodiments relate to a light-emitting diode (LED) lamp apparatus for a vehicle, and more particularly, to an LED lamp apparatus for a vehicle, which is applicable to a vehicle headlamp.

Discussion of the Background

In general, a lamp refers to a device for emitting or adjusting light for specific purposes, and may function as a headlamp, a backlight, a lighting, or a indicator lamp when it is mounted to a vehicle. When the lamp uses LEDs as a light source, the degree of freedom in the design of the lamp can be improved and the lamp has many advantages such as long service life, environment friendliness, and low power consumption. Accordingly, the LEDs have been widely applied as a light source for a vehicle headlamp to improve a quality in vehicle merchantability.

A conventional vehicle LED lamp apparatus is manufactured by performing a surface mounting process of bonding LEDs to a printed circuit board and then performing a further process of connecting LED electrodes to the printed circuit board by wire bonding, wedge bonding, or the like. Hence, there is a problem in that productivity is lowered and process costs are increased. In addition, there is a problem in that heat transfer efficiency is lowered as heat released from LEDs is transferred to a heat sink through the printed circuit board and the size of the heat sink is increased to secure cooling performance.

Therefore, it is necessary to improve these problems.

The foregoing is disclosed in Korean Patent No. 1848557 (published on Apr. 6, 2018, entitled "LED Lamp Unit for Vehicle").

The above information disclosed in this Background section is only for enhancement of understanding of the background of the invention and, therefore, it may contain information that does not constitute prior art.

SUMMARY

Exemplary embodiments of the present invention provide an LED lamp apparatus for a vehicle, which is capable of further improving productivity since it is unnecessary to perform a separate process of connecting an LED electrode and of achieving miniaturization of a heat sink by further increasing efficiency in transfer of heat released from an LED.

Additional features of the invention will be set forth in the description which follows, and in part will be apparent from the description, or may be learned by practice of the invention.

In an embodiment, there is provided an LED lamp apparatus for a vehicle, which includes a heat sink, a printed circuit board including an electric circuit and disposed on the heat sink, an LED disposed between the heat sink and the printed circuit board, the LED being in contact with the heat sink, and an electrode binder extending to the LED through the printed circuit board and electrically connecting the printed circuit board and the LED.

The heat sink may include a board mounting part to which the printed circuit board is mounted, an LED mounting part partially overlapped with the board mounting part, the LED being mounted to the LED mounting part, and an extended heat dissipation part connected to the LED mounting part to dissipate heat transferred through the LED mounting part.

The heat sink may further include an LED indicating part formed on one side or both sides of the LED mounting part to form an indicator for determining an installation position of the LED.

The LED indicating part may include a first reference hole formed on one side of the LED mounting part, and a second reference hole disposed opposite to the first reference hole with the LED mounting part interposed therebetween, such that the LED is positioned at an intermediate portion of an extension line from the first reference hole to the second reference hole.

The heat sink may further include a bending prevention support protruding upward at a height corresponding to the LED on the board mounting part to support the printed circuit board.

The bending prevention support may have a shape embossed upward for buffering an impact force acting on the printed circuit board.

The printed circuit board may include a board body formed with the electric circuit, and an electrode connection hole formed by penetrating the board body and extending toward an electrode of the LED located on the bottom of the board body, from the top of the board body, the electrode binder flowing into the electrode connection hole.

The electrode connection hole may include a first hole group formed at a position corresponding to a positive electrode of a pair of electrodes, the first hole group being configured such that a plurality of first holes spaced apart from each other are arranged in a group.

The electrode connection hole may include a second hole group formed at a position corresponding to a negative electrode of a pair of electrodes, the second hole group being configured such that a plurality of second holes spaced apart from each other are arranged in a group.

The electrode binder may be formed in such a manner that a bonding material positioned on an upper side of the electrode connection hole is melted by exposure to a high-temperature atmosphere, flows downward to the LED through the electrode connection hole, and is then cured.

The electrode binder may fill the electrode connection hole, and an upper portion of the electrode binder may be electrically connected to the printed circuit board, while a lower portion thereof may be electrically connected to the electrode.

The LED may include a base, a board connection formed on an upper surface of the base and facing the printed circuit board, an electrode formed on the board connection and electrically connected to the printed circuit board by the electrode binder, a light emitting part installed on the base and emitting light by electric power supplied through the electrode, and a heat sink joint formed on a lower surface of the base and joined to the heat sink.

As apparent from the above description, in the LED lamp apparatus for a vehicle according to the present invention, since the LED is disposed between the heat sink and the printed circuit board, the heat generated by the LED is directly transferred to the heat sink without passing through the printed circuit board. Thus, it is possible to minimize the thermal resistance applied in the process in which the heat generated by the LED is transferred to the heat sink.

The present invention can further reduce the width of the heat sink while satisfying the same heat dissipation and cooling performance conditions, by minimizing the thermal resistance as described above. Thus, it is possible to achieve the miniaturization of the heat sink and further to achieve the miniaturization and weight reduction of the LED lamp apparatus for a vehicle to which the heat sink is mounted.

In addition, the electrode binder extends downward to the LED through the printed circuit board to electrically connect the printed circuit board and the LED in the present invention. This process can be performed simultaneously with the surface mounting process of mounting the surface mounting part to the printed circuit board. Therefore, it is possible to further improve productivity and thus to accomplish cost reduction since it is unnecessary to sequentially perform the process of connecting the LED electrode to the printed circuit board, independently of the surface mounting process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
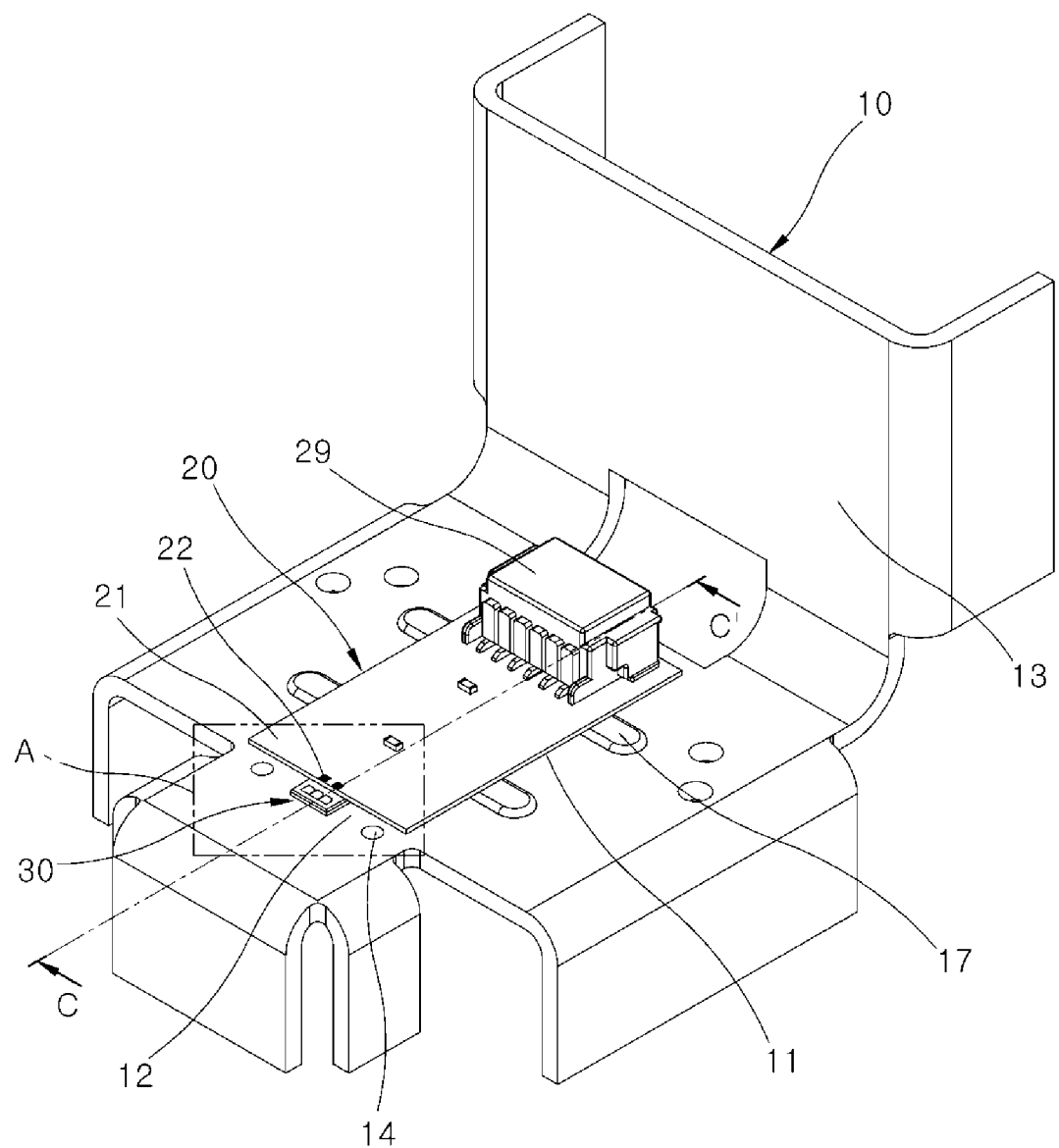
FIG. 1 is a perspective view schematically illustrating an LED lamp apparatus for a vehicle according to an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. Like reference numerals in the drawings denote like elements.

Various advantages and features of the present invention and methods accomplishing thereof will become apparent from the following description of embodiments with reference to the accompanying drawings. However, the present invention is not be limited to the embodiments set forth herein but may be implemented in many different forms. The present embodiments may be provided so that the disclosure of the present invention will be complete, and will fully convey the scope of the invention to those skilled in the art and therefore the present invention will be defined within the scope of claims. Like reference numerals throughout the description denote like elements.

Unless defined otherwise, it is to be understood that all the terms (including technical and scientific terms) used in the specification has the same meaning as those that are understood by those who skilled in the art. Further, the terms defined by the dictionary generally used should not be ideally or excessively formally defined unless clearly defined specifically. It will be understood that for purposes of this disclosure, "at least one of X, Y, and Z" can be construed as X only, Y only, Z only, or any combination of two or more items X, Y, and Z (e.g., XYZ, XYY, YZ, ZZ). Unless particularly described to the contrary, the term "comprise", "configure", "have", or the like, which are described herein, will be understood to imply the inclusion of the stated components, and therefore should be construed as including other components, and not the exclusion of any other elements.

Hereinafter, an LED lamp apparatus for a vehicle according to exemplary embodiments of the present invention will be described below with reference to the accompanying drawings through various examples of embodiments. It should be noted that the drawings are not necessarily to scale and may be exaggerated in thickness of lines or sizes of components for clarity and convenience of description. Furthermore, the terms as used herein are terms defined in consideration of functions of the invention and may change depending on the intention or practice of a user or an operator. Therefore, these terms should be defined based on the overall disclosures set forth herein.

Figure 2:
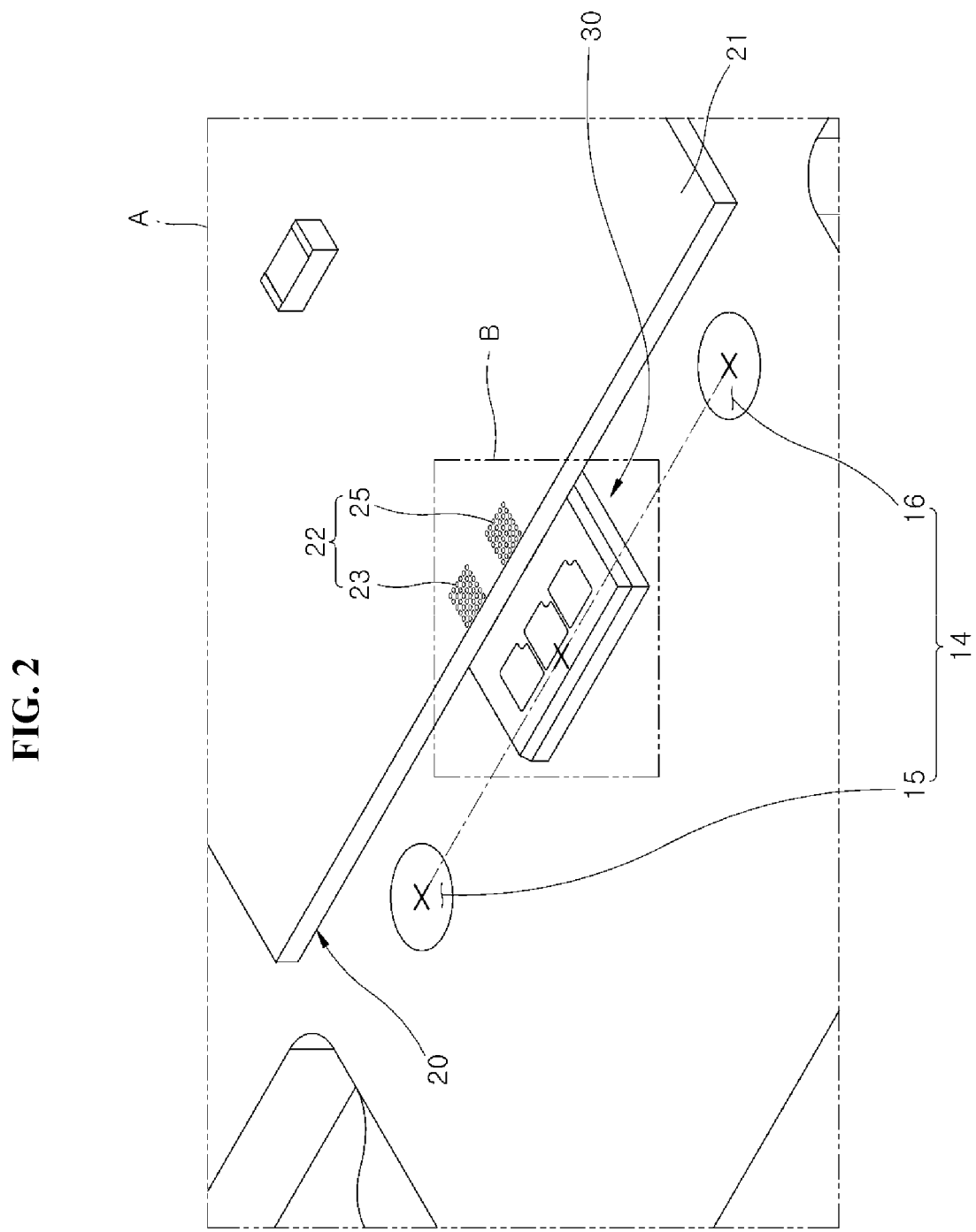
FIG. 2 is an enlarged view of portion A in FIG. 1.
Figure 3:
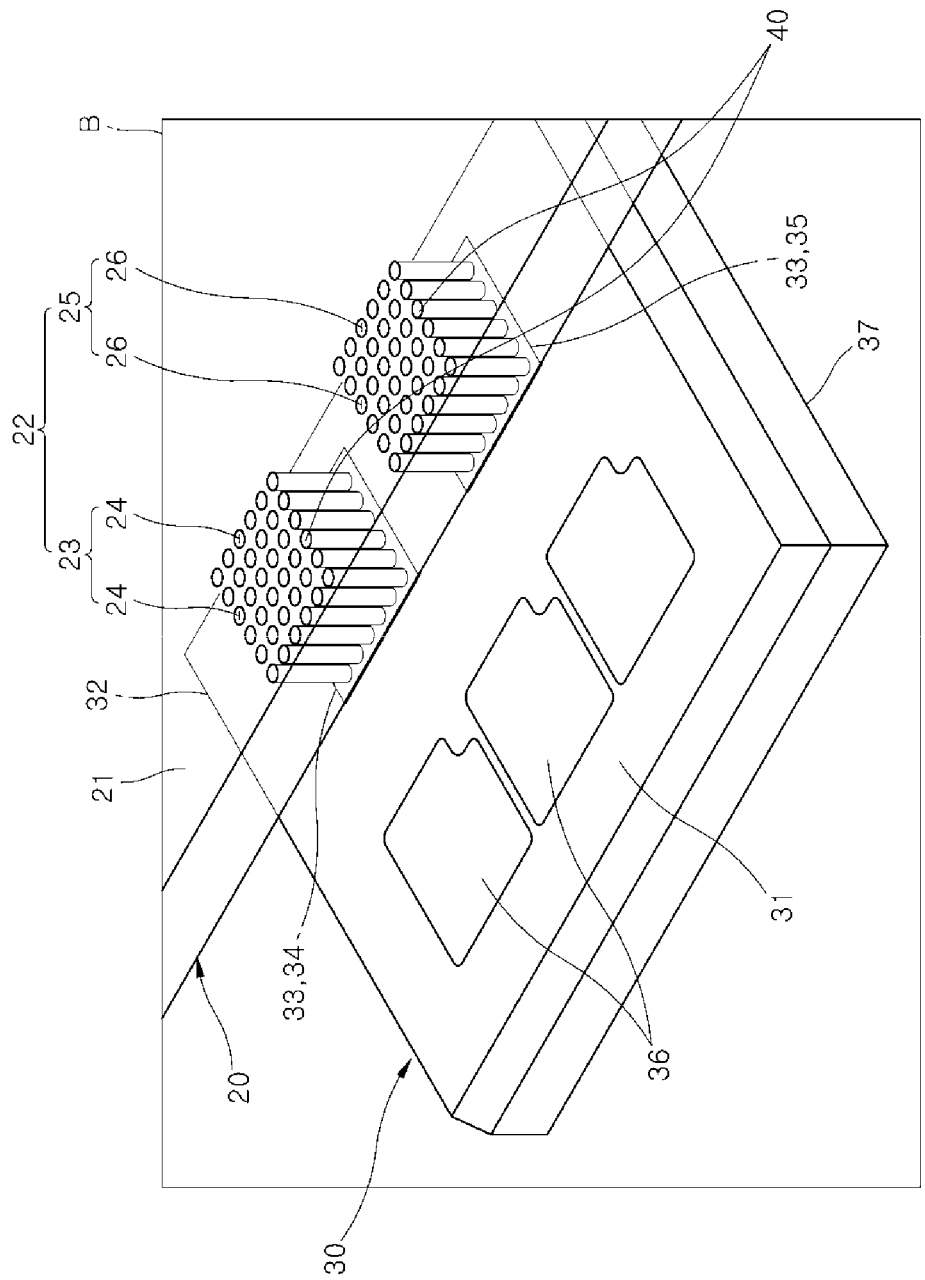
FIG. 3 is an enlarged view of portion B in FIG. 2.

FIG. 1 is a perspective view schematically illustrating an LED lamp apparatus for a vehicle according to an embodiment of the present invention. FIG. 2 is an enlarged view of portion A in FIG. 1. FIG. 3 is an enlarged view of portion B in FIG. 2.

Referring to FIGS. 1, 2, and 3, the LED lamp apparatus for a vehicle according to the embodiment of the present invention includes a heat sink 10, a printed circuit board (PCB) 20, an LED 30, and an electrode binder 40.

The heat sink 10 is a device for preventing the overheating of and damage to the LED 30 by releasing the heat transferred from the LED 30 to the outside, and is made of a metal material capable of stably implementing heat transfer performance. The printed circuit board 20 includes an electric circuit (not illustrated) that supplies the LED 30 with the electric power received from a battery or the like of a vehicle and includes various devices and wirings for supporting the light emitting performance of the LED 30. The printed circuit board 20 is disposed on the heat sink 10.

The LED 30 is a device for emitting light by the electric power supplied through the electric circuit of the printed circuit board 20, and is disposed between the heat sink 10 and the printed circuit board 20. The heat sink 10 is in contact with the bottom of the LED 30 and the printed circuit board 20 is in contact with the top of the LED 30. The electrode binder 40 extends downward to the LED 30 through the printed circuit board 20 from the top of the printed circuit board 20, to electrically connect the electric circuit (not illustrated) of the printed circuit board 20 and an electrode 33 formed on the upper portion of the LED 30.

Figure 4:
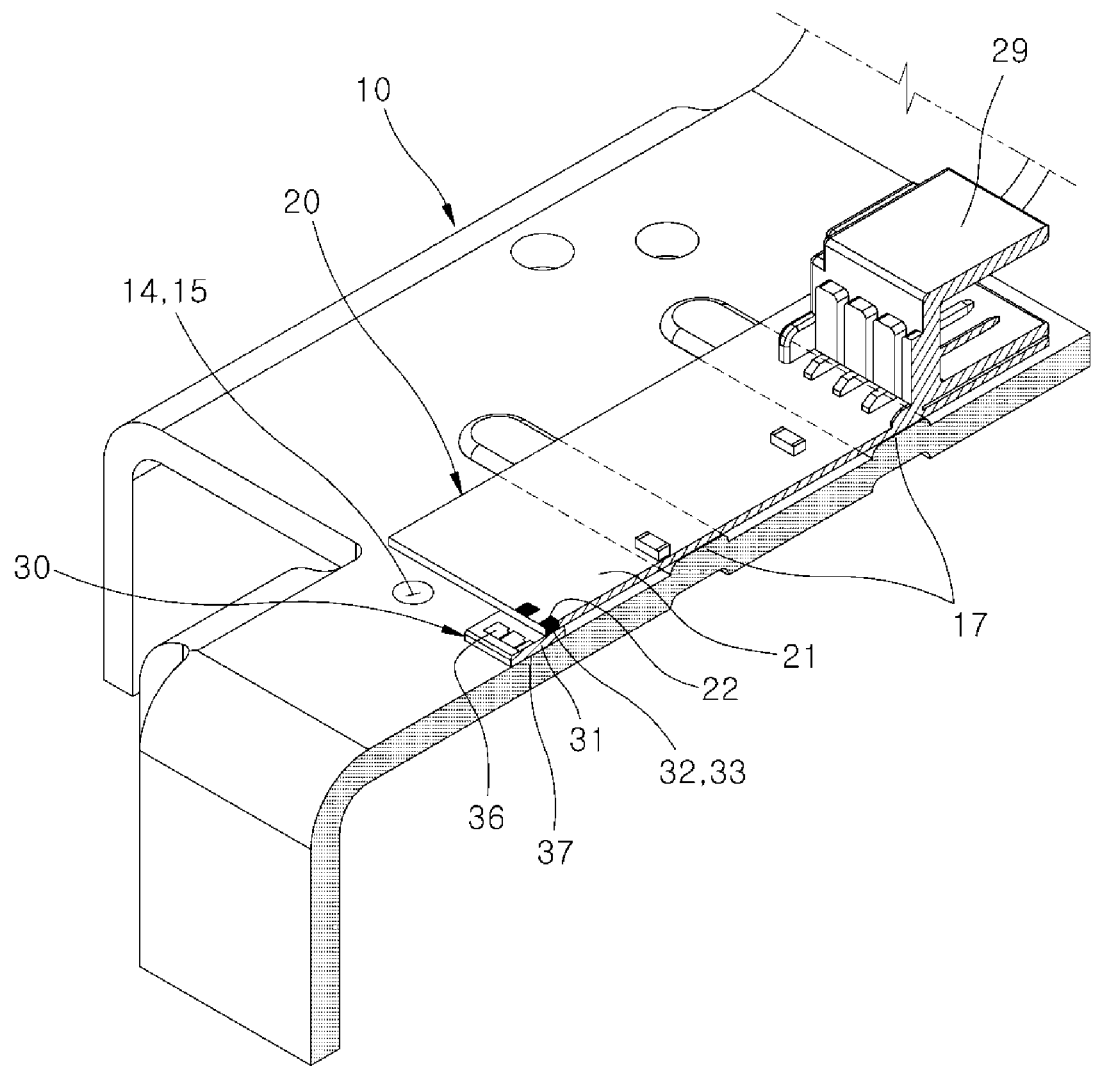
FIG. 4 is a cross-sectional view taken along line C-C' in FIG. 1.
Figure 5:
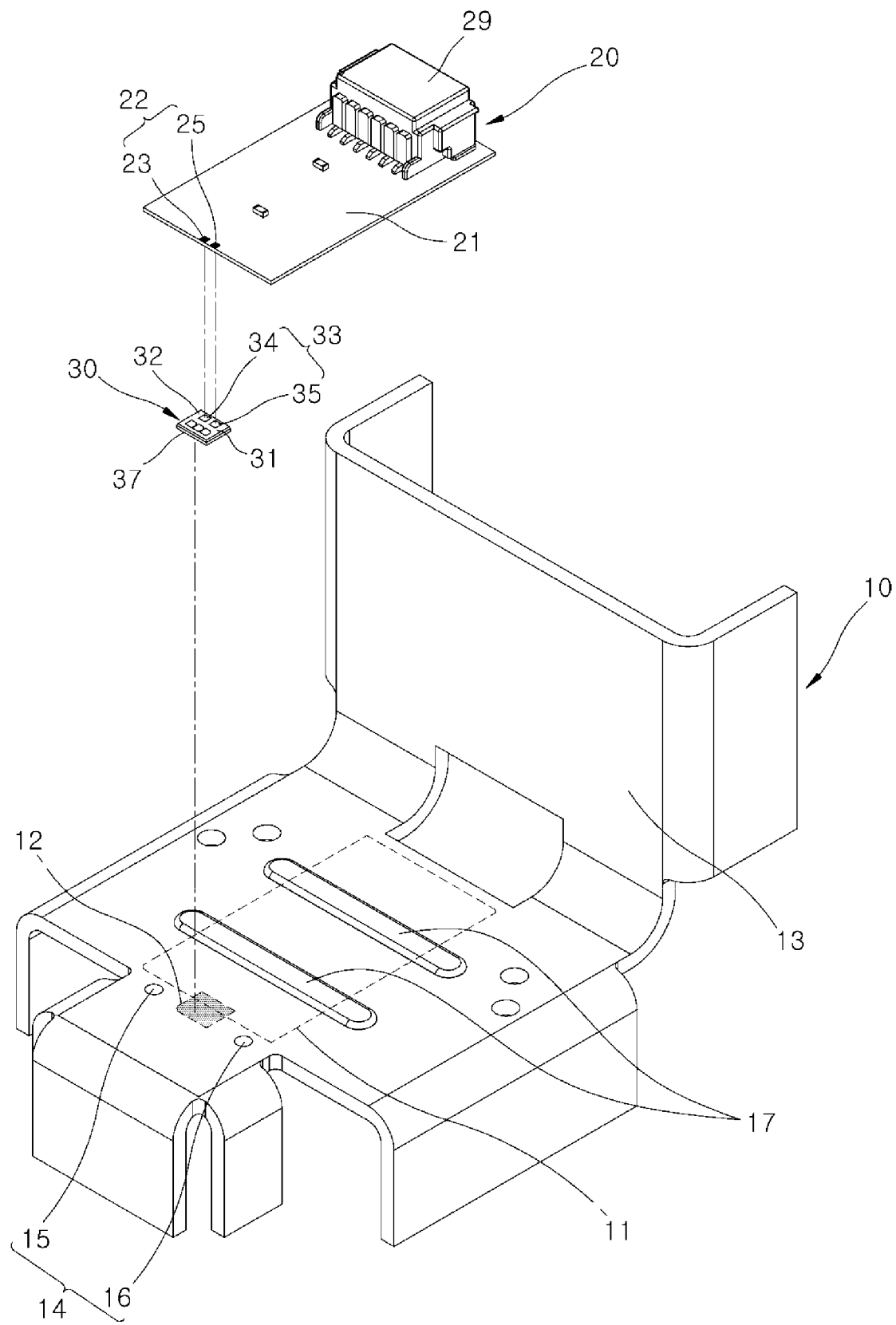
FIG. 5 is an exploded perspective view schematically illustrating main components of the LED lamp apparatus for a vehicle according to the embodiment of the present invention.

FIG. 4 is a cross-sectional view taken along line C-C' in FIG. 1. FIG. 5 is an exploded perspective view schematically illustrating main components of the LED lamp apparatus for a vehicle according to the embodiment of the present invention.

Referring to FIGS. 1 and 5, the heat sink 10 according to the embodiment of the present invention includes a board mounting part 11, an LED mounting part 12, an extended heat dissipation part 13, an LED indicating part 14, and bending prevention supports 17.

The board mounting part 11 is a part to which the printed circuit board 20 is mounted, and has a width corresponding to the printed circuit board 20. The LED mounting part 12 is a part to which the LED 30 is mounted, has a width corresponding to the LED 30, and is partially overlapped with the board mounting part 11. The LED 30 may be bonded onto the LED mounting part 12. An electrode connection hole 22 of the printed circuit board 20 and the electrode 33 of the LED 30 are located at the overlapped portion of the board mounting part 11 and the LED mounting part 12.

The extended heat dissipation part 13 is a part that dissipates the heat transferred through the LED mounting part 12, and is connected continuously to the board mounting part 11 and the LED mounting part 12. The extended heat dissipation part 13 may have various shapes and be bent in various directions in consideration of the assembly with peripheral devices (not illustrated), an installation environment, and the like. The heat generated by the LED 30 is directly transferred to the LED mounting part 12 and is released to the atmosphere through the extended heat dissipation part 13. This action can prevent the LED 30 from overheating.

As the extended heat dissipation part 13 has an increasing width, heat dissipation and cooling performance can be stably secured. According to the present invention, the heat generated by the LED 30 is directly transferred to the heat sink 10 through the LED mounting part 12 without passing through other members (e.g., the printed circuit board 20) as described above. Thus, the thermal resistance can be significantly reduced, compared to when the LED 30 is mounted on the printed circuit board 20, and the same degree of heat dissipation and cooling performance can be implemented even when the width of the extended heat dissipation part 13 is further reduced.

As a result of the experiment, it can be seen that the comparative product, in which the LED 30 is mounted on the printed circuit board 20, has a thermal resistance of 2.6 K/W and a heat radiation area of 18,138 mm$^2$, and that the prototype of the present invention has a thermal resistance of 1.1 K/W and a heat radiation area of 15,260 mm$^2$. According to the present invention, since the above action enables the width of the extended heat dissipation part 13 to be significantly reduced, it is possible to achieve the miniaturization and weight reduction of the LED lamp apparatus for a vehicle and the heat sink 10 thereof.

The LED indicating part 14 is a part forming an indicator for determining the installation position of the LED 30, and is formed on one side or both sides of the LED mounting part 12. Referring to FIGS. 2 and 5, the LED indicating part 14 according to the embodiment of the present invention includes a first reference hole 15 and a second reference hole 16.

The first reference hole 15 is formed by vertically penetrating the extended heat dissipation part 13 on one side of the LED mounting part 12. The second reference hole 16 is disposed opposite to the first reference hole 15 with the LED mounting part 12 interposed therebetween. The second reference hole 16 is also formed by vertically penetrating the extended heat dissipation part 13, similar to the first reference hole 15.

The LED 30 or the LED mounting part 12 may be disposed at a set position on the heat sink 10 in such a manner that, after the first reference hole 15 and the second reference hole 16 are set as a first reference position and the intermediate portion of the extension line connecting the first reference hole 15 and the second reference hole 16 is derived as a second reference position, the LED 30 or the LED mounting part 12 is disposed at the second reference position with a tolerance of ±0.05 mm in an x direction (in a direction parallel to the extension line connecting the first reference hole 15 and the second reference hole 16) and in a y direction (in a direction orthogonal to the x direction).

After the LED 30 is disposed on the LED mounting part 12, the arrangement position thereof may be checked using a positioning device (e.g., an automatic optical inspection (AOI) device) used in a PCB inspection process. Through the above process, the arrangement accuracy and the assembly reliability of the LED 30 can be stably secured.

The bending prevention supports 17 are devices for supporting the printed circuit board 20 at the lower end thereof, and protrude upward at a height corresponding to the LED 30 on the board mounting part 11. Referring to FIGS. 4 and 5, the bending prevention supports 17 are formed linearly across the board mounting part 11, and are formed in parallel with each other at a set interval at two positions corresponding to one side and the other side of the printed circuit board 20, thereby preventing the printed circuit board 20 from tilting in one direction or preventing a portion (e.g., one side proximate to the LED 30 or an intermediate portion) of the printed circuit board 20 from sagging.

The LED 30 is eccentrically disposed on one side of the printed circuit board 20 and the heat sink 10. By forming the bending prevention supports 17 as described above, it is possible to stably define a space, capable of mounting the LED 30 between the printed circuit board 20 and the heat sink 10, at a height corresponding to the LED 30 and to prevent the electrode binder 40 from being cracked or broken while the printed circuit board 20 is tilted or partially sags due to the LED 30.

Since the bending prevention supports 17 have a bended shape upward, they function as a cushion for buffering the impact force acting on the printed circuit board 20. Therefore, the durability against the impact force can be further enhanced. The heat sink 10 may be manufactured by cutting and bending an aluminum (Al) plate and have an embossing shape protruding upward by press working or the like, thereby easily forming the bending prevention supports 17.

Referring to FIGS. 3 and 5, the printed circuit board 20 according to the embodiment of the present invention includes a board body 21 and an electrode connection hole 22.

The board body 21 is a device including an electric circuit (not illustrated) that supplies the LED 30 with the electric power received from a battery (not illustrated) or the like of the vehicle and includes various devices and wirings for supporting the light emitting performance of the LED 30. The board body 21 is disposed and seated on the board mounting part 11 of the heat sink 10. A connector 29 for electrically connecting a power source such as a vehicle battery to an electric circuit is mounted to the board body 21. A flame retardant (FR)-4 PCB may be used as the board body 21.

The electrode connection hole 22 is a portion forming a passage for the introduction, flow, and accommodation of the electrode binder 40, and is formed by vertically penetrating the board body 21. The electrode connection hole 22 extends toward the electrode 33 of the LED 30 located on the bottom of the board body 21 from the top of the board body 21. The electrode connection hole 22 is formed at a position corresponding to the overlapped portion of the board mounting part 11 and the LED mounting part 12, more specifically, at a position corresponding to each of the pair of electrodes 33 provided to the LED 30. The electrode connection hole 22 according to the embodiment of the present invention includes a first hole group 23 and a second hole group 25.

The first hole group 23 is formed at a position corresponding to a positive electrode 34 of the pair of electrodes 33, and has a structure in which a plurality of first holes 24 spaced apart from each other are arranged in a group. The second hole group 25 is formed at a position corresponding to a negative electrode 35 of the pair of electrodes 33, and has a structure in which a plurality of second holes 26 spaced apart from each other are arranged in a group. Each of the first and second holes 24 and 26 may be micro-sized.

The electrode connection hole 22 is formed in such a manner that one hole is not formed at a position corresponding to each of the electrodes 33 but the plurality of holes (first and second holes 24 and 26) having a smaller diameter are grouped as described above. Thus, the molten electrode binder 40 may evenly reach over the entire electrode 33 through the plurality of holes without being one-sided, thereby ensuring structural stability and robustness. In addition, it is possible to further reduce deterioration in the stiffness of the board body 21 by formation of the holes.

Referring to FIGS. 3 and 5, the LED 30 according to the embodiment of the present invention includes a base 31, a board connection 32, an electrode 33, a light emitting part 36, and a heat sink joint 37.

The base 31 is a portion forming the basic frame of the LED 30, and has a flat chip shape that includes a flat lower surface easily seated in place on the heat sink 10 (i.e., on the LED mounting part 12) and a flat upper surface capable of stably coming into contact with the bottom of the printed circuit board 20. The board connection 32 is a portion facing the printed circuit board 20, and is formed on the upper surface of the base 31. The fact that the LED 30 has the board connection 32 means that a portion of the LED 30 is overlapped with a portion of the printed circuit board 20.

The electrode 33 is a portion that is electrically connected to the printed circuit board 20 by the electrode binder 40, and is formed on the board connection 32. The electrode 33 consists of a pair of electrodes including a positive electrode 34 and a negative electrode 35, and the upper portions of the electrodes 33 communicate with the electrode connection hole 22 including the first hole group 23 and the second hole group 25.

The light emitting part 36 is a device that receives electric power through the electrode 33 to emit light. The light emitting part 36 is installed at a portion of the base 31 other than the board connection 32, and emits light without interference with the printed circuit board 20. The heat sink joint 37 is a portion joined to the heat sink 10, and is formed on the lower surface of the base 31. The heat generated while light is emitted by the light emitting part 36 is directly transferred to the LED mounting part 12 of the heat sink 10 through the heat sink joint 37, and is released to the atmosphere through the extended heat dissipation part 13.

As described above, the heat generated by the LED 30 is directly transferred to the heat sink 10 without passing through the printed circuit board 20. Thus, the thermal resistance can be reduced, and thus the heat dissipation and cooling performance can be further improved. This action can efficiently prevent the LED 30 from overheating and enables the miniaturization and weight reduction of the LED lamp apparatus for a vehicle.

Figure 6:
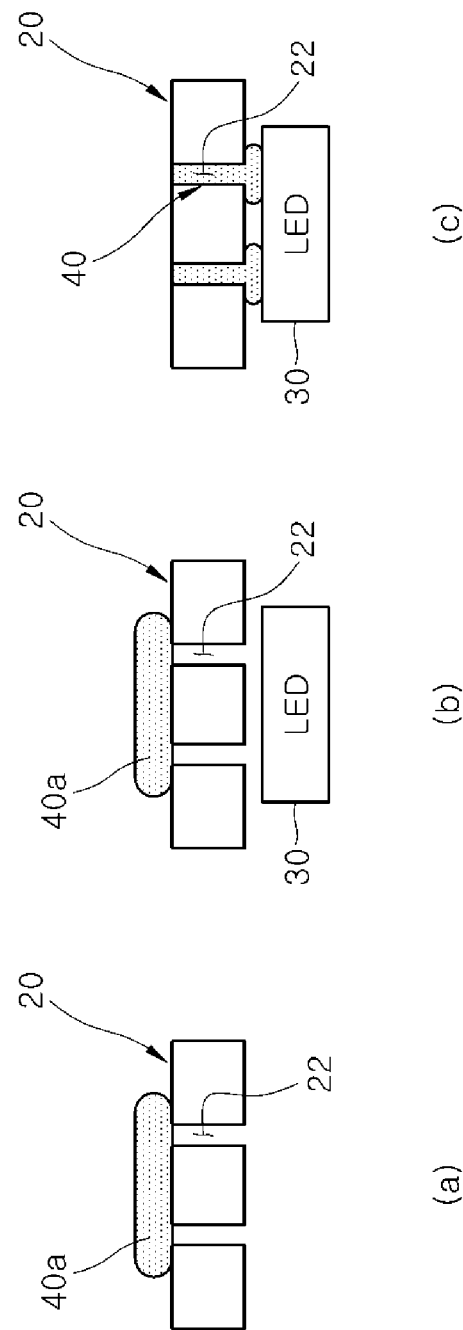
FIG. 6 is a conceptual view for explaining a process of connecting an LED electrode to a printed circuit board in the LED lamp apparatus for a vehicle according to the embodiment of the present invention.

FIG. 6 is a conceptual view for explaining a process of connecting the LED electrode to the printed circuit board in the LED lamp apparatus for a vehicle according to the embodiment of the present invention.

Referring to FIGS. 3 and 6, the electrode binder 40 extends to the lower portion of the electrode connection hole 22 to be joined to the LED 30 in the state in which the electrode connection hole 22 is filled with the electrode binder 40. In this case, a portion of the electrode binder 40, which is located in the upper portion and inner portion of the electrode connection hole 22, is electrically connected to the electric circuit (not illustrated) of the printed circuit board 20, and the lower portion of the electrode binder 40 is connected to the electrode 33 of the LED 30.

A bonding material 40a, which is a material of the electrode binder 40, is positioned on the upper portion of the electrode connection hole 22 of the printed circuit board 20 as illustrated in FIG. 6(a), and the LED 30 is positioned beneath the printed circuit board 20 as illustrated in FIG. 6(b). In this state, when they are exposed to a high-temperature atmosphere, the bonding material 40a molten in the high-temperature atmosphere is naturally introduced into the electrode connection hole 22. The bonding material 40a introduced into the electrode connection hole 22 flows downward to the electrode 33 of the LED 30 while filling the electrode connection hole 22 as illustrated in FIG. 6(c), and is then cooled and cured. The electrode binder 40 may be formed through the above process.

The process illustrated in FIG. 6(a) may be performed during a silkscreen printing process of transferring PCB ink onto the printed circuit board 20, the process illustrated in FIG. 6(b) may be performed during a pick-and-place process, and the process illustrated in FIG. 6(c) may be performed during a reflow soldering process. That is, the process of connecting the printed circuit board 20 and the LED 30 with the electrode binder 40 according to the present invention can be performed together with a process of mounting and soldering surface mounting parts to the printed circuit board 20 by a surface mount technology (SMT).

According to the configuration of the present invention, the process of electrically connecting the printed circuit board 20 and the LED 30 with the electrode binder 40 is not performed separately from but can be performed simultaneously with the surface mounting process of mounting surface mounting parts, such as various devices and connectors, to the printed circuit board 20, as described above. Therefore, it is possible to significantly improve productivity, compared to the conventional method in which the surface mounting process and the process of forming the electrode of the LED 30 are performed sequentially and independently.

According to the LED lamp apparatus for a vehicle according to the present invention having the above configuration, since the LED 30 is disposed between the heat sink 10 and the printed circuit board 20, the heat generated by the LED 30 is directly transferred to the heat sink 10 without passing through the printed circuit board 20. Thus, it is possible to minimize the thermal resistance applied in the process in which the heat generated by the LED 30 is transferred to the heat sink 10.

According to the present invention, it is possible to further reduce the width of the heat sink 10 while satisfying the same heat dissipation and cooling performance conditions, by minimizing the thermal resistance as described above. Thus, it is possible to achieve the miniaturization of the heat sink 10 and further to achieve the miniaturization and weight reduction of the LED lamp apparatus for a vehicle to which the heat sink 10 is mounted.

According to the present invention, the electrode binder 40 extends downward to the LED 30 through the printed circuit board 20 to electrically connect the printed circuit board 20 and the LED 30. This process can be performed simultaneously with the surface mounting process of mounting the surface mounting parts to the printed circuit board. Therefore, it is possible to further improve productivity and thus to accomplish cost reduction since it is unnecessary to sequentially perform the process of connecting the electrode 33 of the LED 30 to the printed circuit board 20, independently of the surface mounting process. While various embodiments have been described above, it will be understood to those skilled in the art that the embodiments described are by way of example only. Accordingly, the passenger airbag chute described herein should not be limited based on the described embodiments.

Although exemplary embodiments of the present disclosure have been shown and described hereinabove, the present disclosure is not limited to specific exemplary embodiments described above, but may be various modified by those skilled in the art to which the present disclosure pertains without departing from the scope and spirit of the disclosure as disclosed in the accompanying claims. In addition, such modifications should also be understood to fall within the scope and spirit of the present disclosure.

What is claimed is:

1. A light-emitting diode (LED) lamp apparatus for a vehicle, comprising:
    a heat sink;
    a printed circuit board including an electric circuit and being disposed on the heat sink, the printed circuit board being rigid and further including a through-hole;
    an LED disposed between the heat sink and the printed circuit board, the LED being in contact with the heat sink; and
    an electrode binder extending to the LED through the through-hole in the printed circuit board, the electrode binder electrically connecting the printed circuit board and the LED.

2. The LED lamp apparatus according to claim 1, wherein the heat sink comprises:
    a board mounting part on which the printed circuit board is mounted;
    an LED mounting part partially overlapping with the board mounting part, the LED being mounted on the LED mounting part; and
    an extended heat dissipation part connected to the LED mounting part and being configured to dissipate heat transferred through the LED mounting part.

3. The LED lamp apparatus according to claim 2, wherein the heat sink further comprises an LED indicating part formed on one side or both sides of the LED mounting part to form an indicator for determining an installation position of the LED.

4. The LED lamp apparatus according to claim 3, wherein the LED indicating part comprises:
    a first reference hole formed on one side of the LED mounting part; and
    a second reference hole disposed opposite to the first reference hole with the LED mounting part interposed therebetween, the LED being positioned at an intermediate portion of an extension line from the first reference hole to the second reference hole.

5. The LED lamp apparatus according to claim 2, wherein the heat sink further comprises a bending prevention support protruding upward at a height corresponding to the LED on the board mounting part to support the printed circuit board.

6. The LED lamp apparatus according to claim 5, wherein the bending prevention support has a shape embossed upward and being configured to buffer an impact force on the printed circuit board.

7. The LED lamp apparatus according to claim 1, wherein the printed circuit board comprises:
    a board body formed with the electric circuit; and
    the through-hole forming an electrode connection hole penetrating through the board body toward an electrode of the LED, which is disposed below the board body, the electrode binder filling into the electrode connection hole.

8. The LED lamp apparatus according to claim 7, wherein the electrode connection hole comprises a first hole group formed at a position corresponding to a positive electrode of a pair of electrodes of the LED, the first hole group being configured such that a plurality of first holes spaced apart from each other are arranged in a first group.

9. The LED lamp apparatus according to claim 8, wherein the electrode connection hole further comprises a second hole group formed at a position corresponding to a negative electrode of the pair of electrodes, the second hole group being configured such that a plurality of second holes spaced apart from each other are arranged in a second group spaced apart from the first group.

10. The LED lamp apparatus according to claim 7, wherein the electrode binder is formed in such a manner that a bonding material positioned on an upper side of the electrode connection hole is melted by exposure to a high-temperature atmosphere, flows downward to the LED through the electrode connection hole, and is then cured.

11. The LED lamp apparatus according to claim 7, wherein the electrode binder is configured to fill the electrode connection hole, an upper portion of the electrode binder is electrically connected to the printed circuit board, and a lower portion of the electrode binder is electrically connected to the electrode of the LED.

12. The LED lamp apparatus according to claim 1, wherein the LED comprises:
    a base;
    a board connection formed on an upper surface of the base and facing the printed circuit board;
    an electrode formed on the board connection and electrically connected to the printed circuit board by the electrode binder;
    a light emitting part formed on the base and configured to emit light by electric power supplied through the electrode; and
    a heat sink joint formed on a lower surface of the base and connected to the heat sink.

13. A light-emitting diode (LED) lamp apparatus of a vehicle, comprising:
    a heat sink;
    an LED comprising:
        a base substrate;

a light-emitting part formed on a first surface of the base substrate;

an electrode formed on the first surface of the base substrate; and a heat sink joint coupling a second surface of the base substrate directly to the heat sink, the second surface opposing the first surface;

a printed circuit board (PCB) disposed on the heat sink and overlapping a portion of the base substrate, the PCB being spaced apart from the light-emitting part and comprising:

a through-hole overlapping the electrode; and an electric circuit configured to provide power to the electrode; and an electrode binder extending through the through-hole and forming an electric connection between the electric circuit and the electrode.

* * * * *